United States Patent
Yang et al.

(10) Patent No.: US 11,227,814 B2
(45) Date of Patent: Jan. 18, 2022

(54) THREE-DIMENSIONAL SEMICONDUCTOR PACKAGE WITH PARTIALLY OVERLAPPING CHIPS AND MANUFACTURING METHOD THEREOF

(71) Applicant: NANYA TECHNOLOGY CORPORATION, New Taipei (TW)

(72) Inventors: Wu-Der Yang, Taoyuan (TW); Chun-Huang Yu, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/819,709

(22) Filed: Mar. 16, 2020

(65) Prior Publication Data

US 2021/0287967 A1    Sep. 16, 2021

(51) Int. Cl.
*H01L 23/34* (2006.01)
*H01L 23/48* (2006.01)
(Continued)

(52) U.S. Cl.
CPC ........ *H01L 23/4951* (2013.01); *H01L 21/563* (2013.01); *H01L 23/49513* (2013.01);
(Continued)

(58) Field of Classification Search
CPC ... H01L 21/563; H01L 24/14; H01L 2224/81; H01L 23/49816; H01L 24/83;
(Continued)

(56) References Cited

U.S. PATENT DOCUMENTS

| 10,049,953 B2 * | 8/2018 | Yu ........................... H01L 24/24 |
| 2009/0134528 A1 * | 5/2009 | Lee .................... H01L 23/49816 |
| | | 257/777 |

(Continued)

FOREIGN PATENT DOCUMENTS

| TW | 201810555 A | 3/2018 |
| TW | 201839941 A | 11/2018 |

(Continued)

OTHER PUBLICATIONS

Office Action dated Aug. 30, 2021 in TW Application No. 110104046, 10 pages.

*Primary Examiner* — Alonzo Chambliss
(74) *Attorney, Agent, or Firm* — Muncy, Geissler, Olds and Lowe, P.C.

(57) ABSTRACT

The present application provides a semiconductor package and a manufacturing method thereof. The semiconductor package includes a first device, first electrical connectors, a second device and second electrical connectors. The first device is attached to a package substrate. An active side of the first device die faces toward the package substrate. The first electrical connectors connect the active side of the first device die to the package substrate. The second device die is stacked over the first device die. An active side of the second device die faces toward the package substrate. A portion of the active side of the second device die is outside an area that overlaps the first device die. The second electrical connectors connect the portion of the active side of the second device die to the package substrate.

9 Claims, 11 Drawing Sheets

(51) Int. Cl.
    *H01L 21/00*           (2006.01)
    *H01L 21/44*           (2006.01)
    *B23K 31/02*           (2006.01)
    *H01L 23/495*         (2006.01)
    *H01L 23/544*         (2006.01)
    *H01L 21/56*           (2006.01)
    *H01L 23/498*         (2006.01)
    *H01L 23/00*           (2006.01)
    *H01L 25/00*           (2006.01)

(52) U.S. Cl.
    CPC ...... *H01L 23/49816* (2013.01); *H01L 23/544* (2013.01); *H01L 24/81* (2013.01); *H01L 24/83* (2013.01); *H01L 25/50* (2013.01); *H01L 2224/81* (2013.01)

(58) Field of Classification Search
    CPC ............. H01L 24/81; H01L 23/4951; H01L 23/49513; H01L 23/544; H01L 25/0657; H01L 25/50; H01L 24/32; H01L 24/16; H01L 24/05
    See application file for complete search history.

(56) References Cited

U.S. PATENT DOCUMENTS

| | | | |
|---|---|---|---|
| 2012/0038064 A1* | 2/2012 | Camacho | H01L 21/4832 257/777 |
| 2013/0147063 A1* | 6/2013 | Park | H01L 23/5389 257/777 |
| 2018/0197837 A1* | 7/2018 | Yu | H01L 21/56 |
| 2019/0074261 A1* | 3/2019 | Yu | H01L 21/31053 |
| 2020/0185330 A1* | 6/2020 | Yu | H01L 25/105 |
| 2020/0381397 A1* | 12/2020 | Yu | H01L 25/0657 |

FOREIGN PATENT DOCUMENTS

| | | |
|---|---|---|
| TW | 201841314 A | 11/2018 |
| TW | 201944566 A | 11/2019 |

* cited by examiner

THREE-DIMENSIONAL SEMICONDUCTOR PACKAGE WITH PARTIALLY OVERLAPPING CHIPS AND MANUFACTURING METHOD THEREOF

TECHNICAL FIELD

The present disclosure relates to a semiconductor package and a manufacturing method thereof, and more particularly, to a three-dimensional semiconductor package and a manufacturing method thereof.

DISCUSSION OF THE BACKGROUND

The semiconductor industry has experienced continuous growth due to constant improvement in integration density of various electronic components. This improvement has been primarily based on repeated reductions in minimum feature size, allowing more components to be integrated into a given chip area.

Such integration improvement is essentially two-dimensional (2D) in nature, in that the volume occupied by the integrated components is essentially on the surface of semiconductor wafer. Although dramatic improvements in lithography have resulted in considerable improvement in 2D integrated circuit formation, there are physical limitations to the density that can be achieved in two dimensions. While 2D scaling remains an option for new designs, adopting three-dimensional packaging schemes that utilize the z-direction has become a focus of research in the industry.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a semiconductor package is provided. The semiconductor package comprises: a first device die, attached to a package substrate, wherein an active side of the first device die faces toward the package substrate; first electrical connectors, connecting the active side of the first device die to the package substrate; a second device die, stacked over the first device die, wherein an active side of the second device die faces toward the package substrate, and a portion of the active side of the second device die is outside of an area that overlaps the first device die; and second electrical connectors, connecting the portion of the active side of the second device die to the package substrate.

In some embodiments, the second electrical connectors have a height greater than a height of the first electrical connectors.

In some embodiments, the semiconductor package further comprises: a first adhesive material, disposed between the first device die and the package substrate; and a second adhesive material, disposed between the first device die and the second device die.

In some embodiments, a portion of the first device die is not covered by the second adhesive material.

In some embodiments, the first electrical connectors respectively comprise a first conductive pillar and a first solder joint connecting the first conductive pillar to the package substrate, and the second electrical connectors respectively comprise a second conductive pillar and a second solder joint connecting the second conductive pillar to the package substrate.

In some embodiments, the second conductive pillars have a height greater than a height of the first conductive pillars.

In some embodiments, the package substrate comprises a stack of built-up dielectric layers and layers of conductive patterns respectively formed at a side of one of the built-up dielectric layers.

In some embodiments, the semiconductor package further comprises: an encapsulant, laterally encapsulating the first device die, the second device die, the first electrical connectors and the second electrical connectors.

In some embodiments, a sidewall of the encapsulant is substantially coplanar with a sidewall of the package substrate.

In some embodiments, the semiconductor package further comprises: package inputs/outputs (I/Os), formed at a side of the package substrate facing away from the first device die and the second device die.

In another aspect of the present disclosure, a semiconductor package is provided. The semiconductor package comprises: a first device die, attached to a package substrate, wherein an active side of the first device die faces toward the package substrate; first electrical connectors, connecting the active side of the first device die to the package substrate; a second device die, stacked over the first device die and having conductive pads and redistribution structures at an active side of the second device die, wherein the active side of the second device die faces toward the package substrate, the conductive pads are located within a central region of the active side of the second device die overlapping the first device die, and the redistribution structures connect the conductive pads to a peripheral region of the active side of the second device die outside of an area overlapping the first device die; and second electrical connectors, connecting the package substrate to portions of the redistribution structures within the peripheral region of the active side of the second device die.

In some embodiments, the redistribution structures respectively comprise: a redistribution pad located within the peripheral region of the active side of the second device die; and a conductive line, connecting the redistribution pad to one of the conductive pads.

In some embodiments, the second electrical connectors connect the redistribution pads to the package substrate.

In some embodiments, the first device die has conductive pads formed at the active side of the first device die, and the first electrical connectors connect the conductive pads of the first device die to the package substrate.

In yet another aspect of the present disclosure, a manufacturing method of a semiconductor package is provided. The method comprises: attaching a first device die to a package substrate, wherein an active side of the attached first device die faces toward the package substrate, first electrical connectors are pre-formed on the active side of the first device die before attachment of the first device die, and the electrical connectors connect the active side of the first device die to the package substrate after the attachment of the first device die; and attaching a second device die to the first device die and the package substrate, wherein an active side of the attached second device die faces toward the first device die and the package substrate, a portion of the active side of the attached second device die is outside of an area overlapping the attached first device die, second electrical connectors are pre-formed on the portion of the active side of the second device die before attachment of the second device die, and the second electrical connectors connect the portion of the active side of the second device die to the package substrate after the attachment of the second device die.

In some embodiments, the manufacturing method of the semiconductor package further comprises: forming a first adhesive material on the package substrate before the attachment of the first device die, wherein the first adhesive material is disposed between the package substrate and the active side of the first device die after the attachment of the first device die.

In some embodiments, the manufacturing method of the semiconductor package further comprises: forming a second adhesive material on the first device die before the attachment of the second device die, wherein the second adhesive material is disposed between the first device die and the active side of the second device die after the attachment of the second device die.

In some embodiments, the second device die is pre-formed with conductive pads and redistribution structures at the active side of the second device die, the conductive pads are located within a central region of the active side of the second device die overlapping the first device die, the redistribution structures connect the conductive pads to a peripheral region of the active side of the second device die outside of an area overlapping the first device die, and the second electrical connectors connect the redistribution structures to the package substrate after the attachment of the second device die.

In some embodiments, the manufacturing method of the semiconductor package further comprises: laterally encapsulating the first and second device dies by an encapsulant after the attachment of the second device die.

In some embodiments, the manufacturing method of the semiconductor package further comprises: forming package inputs/outputs (I/Os) at a side of the package substrate facing away from the attached first and second device dies.

As described above, the semiconductor package according to embodiments of the present disclosure includes a bottom device die and a top device die stacked over the bottom device die. The bottom device die and the top device die are bonded to a package substrate through electrical connectors, and active sides of the bottom device die and the top device die both face toward the package substrate. As compared to a multi-die semiconductor package in which an active side of each device die faces away from a package substrate and is electrically connected to the package substrate through bonding wires, the electrical connectors of the present disclosure may have a smaller length. Moreover, the electrical connectors of the present disclosure may have a thicker diameter due to having conductive pillars, rather than bonding wires. Therefore, resistivity of the electrical connectors as well as impedance of the electrical connectors under high frequency can be reduced, and electrical connection between the die stack (including the bottom device die and the top device die) can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
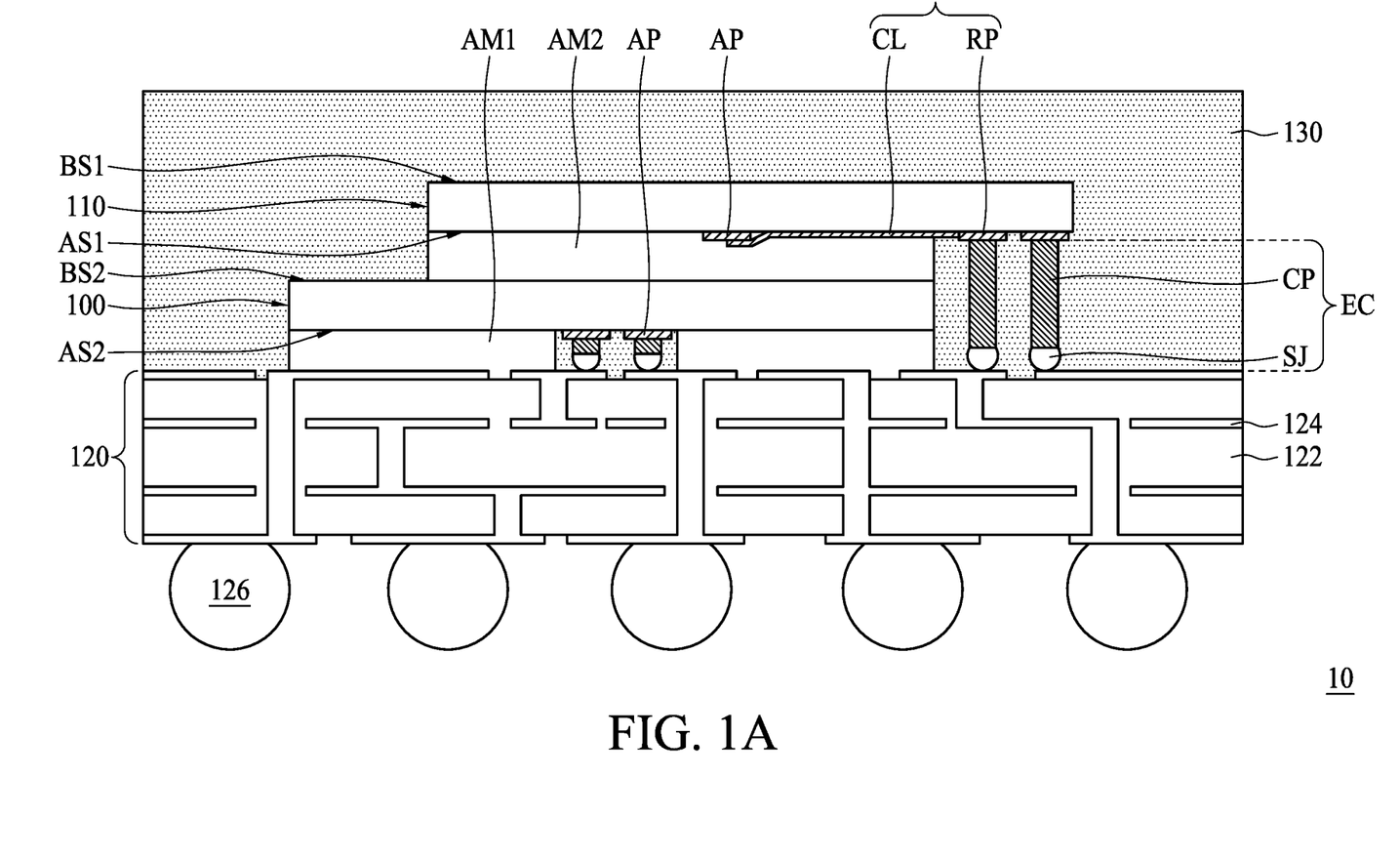
FIG. 1A is a schematic cross-sectional view illustrating a semiconductor package according to some embodiments of the present disclosure.
Figure 1B:
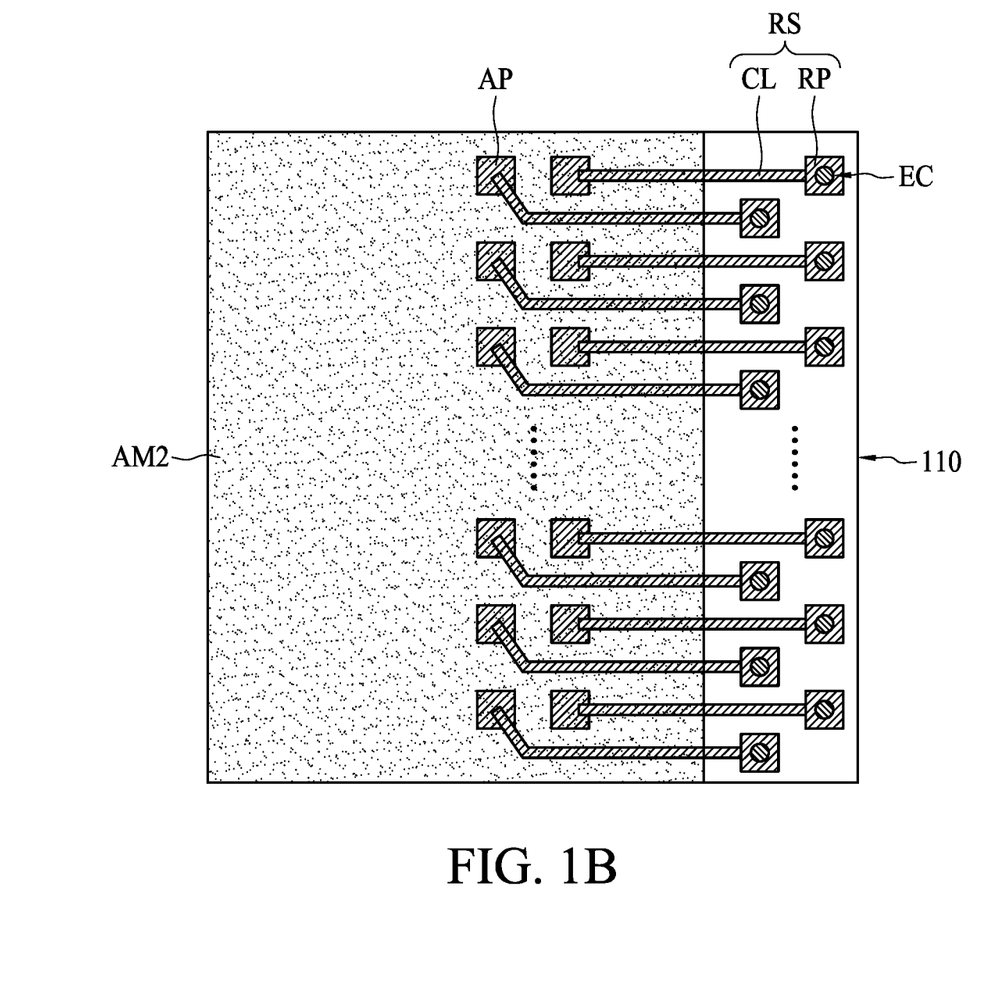
FIG. 1B is a schematic plan view illustrating an active side of a top device die in the semiconductor package shown in FIG. 1A.
Figure 1C:
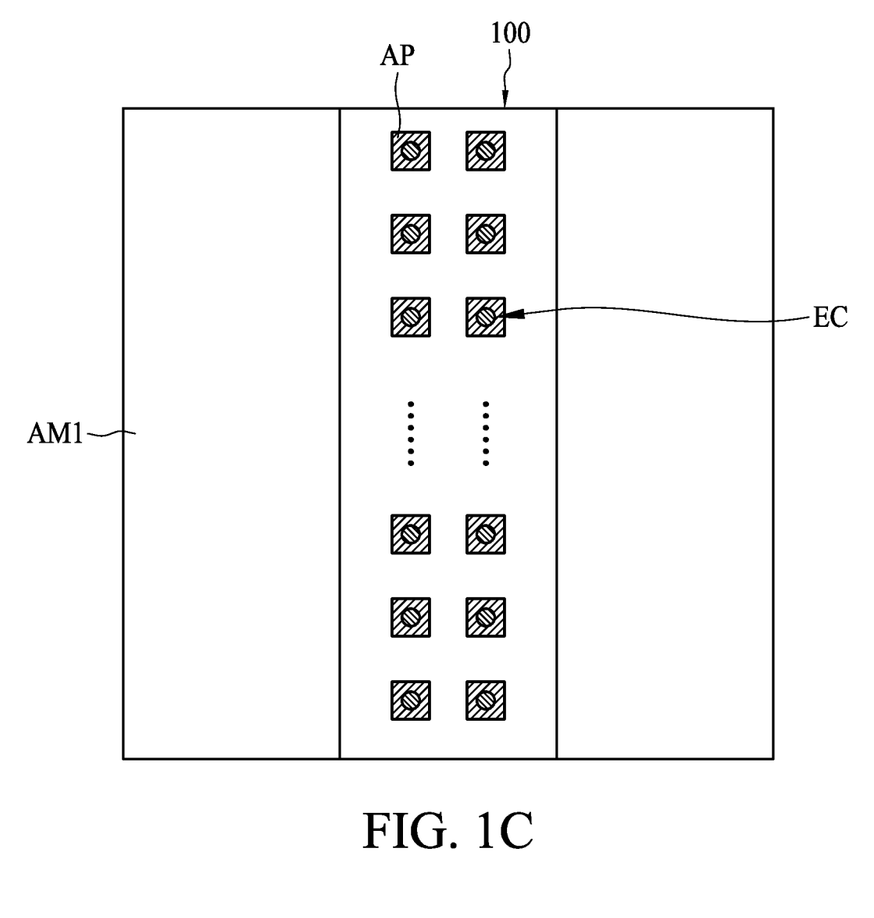
FIG. 1C is a schematic plan view illustrating an active side of a bottom device die in the semiconductor package shown in FIG. 1A.

FIG. 1A is a schematic cross-sectional view illustrating a semiconductor package according to some embodiments of the present disclosure. FIG. 1B is a schematic plan view illustrating an active side of a top device die in the semiconductor package shown in FIG. 1A. FIG. 1C is a schematic plan view illustrating an active side of a bottom device die in the semiconductor package shown in FIG. 1A.

Referring to FIG. 1A, in some embodiments, the semiconductor package 10 is a dual die semiconductor package. In these embodiments, the semiconductor package 10 may include a bottom device die 100 and a top device die 110 stacked on the bottom device die 100. The bottom device die 100 and the top device die 110 are both bonded to a package substrate 120 via a flip chip bonding procedure. As a result, an active side AS1 of the top device die 110 and an active side AS2 of the bottom device die 100 face toward the package substrate 120, while a back side BS1 of the top device die 110 and a back side BS2 of the bottom device die 100, which are opposite to the active sides AS1, AS2, face away from the package substrate 120. The active side of a device die (e.g., the active side AS1 of the top device die 110 or the active side AS2 of the bottom device die 100) refers to a side of the device die on which conductive pads AP are formed. The conductive pads AP may function as inputs/outputs (I/Os) of an integrated circuit formed in the device die, and may be electrically connected to active/passive devices (not shown) through interconnection structures (not shown). In some embodiments, the top device die 110 and the bottom device die 100 are memory dies, such as dynamic random-access memory (DRAM) dies. In addition, the top device die 110 may be substantially identical to the bottom device die 100 in terms of circuits and dimension. Alternatively, the top device die 110 and the bottom device die 100 may be different from each other in terms of circuits, dimension or other characteristics.

The top device die 110 is laterally offset from the bottom device die 100, such that a peripheral portion of the top device die 110 is outside of an area that overlaps the bottom device die 100, and thus the top device die 110 can be bonded to the package substrate 120 via the peripheral portion. In some embodiments, the top device die 110 and the bottom device die 100 are bonded to the package substrate 120 by electrical connectors EC. The electrical connectors EC may respectively include a conductive pillar CP and a solder joint SJ. A terminal of the conductive pillar CP is connected to one of the conductive pads AP, and the other terminal of the conductive pillar CP is connected to the package substrate 120 through the solder joint SJ. Because a vertical spacing between the top device die 110 and the package substrate 120 is greater than a vertical spacing between the bottom device die 100 and the package substrate 120, the conductive pillars CP connecting the top device die 110 to the package substrate 120 are taller than the conductive pillars CP connecting the bottom device die 100 to the package substrate 120. In some embodiments, a height of the conductive pillars CP connecting the top device die 110 to the package substrate 120 may be between 50 and 250 μm, while a height of the conductive pillars CP connecting the bottom device die 100 to the package substrate 120 may be between 30 and 190 μm. In some embodiments, a material of the conductive pillar CP may include metal (e.g., copper or copper alloy), while the solder joint SJ is made of a solder material. However, the present disclosure is not limited thereto, and those skilled in the art may modify dimensions and materials of the electrical connectors EC according to process requirements.

Referring to FIG. 1A, FIG. 1B and FIG. 1C, in some embodiments, the conductive pads AP are formed on central portions of the top device die 110 and the bottom device die 100. For instance, as shown in FIG. 1B, the conductive pads AP within the central portion of the top device die 110 are arranged as two columns. Similarly, as shown in FIG. 1C, the conductive pads AP within the central portion of the bottom device die 100 may be arranged as two columns. However, the present disclosure is not limited thereto, and those skilled in the art may modify the arrangement of the conductive pads AP according to design requirements. In some embodiments, as shown in FIG. 1A and FIG. 1B, the electrical connectors EC connecting the peripheral portion of the top device die 110 to the package substrate 120 may be laterally offset from the conductive pads AP within the central portion of the top device die 110. A redistribution structure RS may be formed on the active side AS1 of the top device die 110 for routing the conductive pads AP of the top device die 110 to the peripheral portion of the top device die 110, such that an electrical connection between the conductive pads AP within the central portion of the top device die 110 and the conductive pillars CP connected to the peripheral portion of the top device die 110 can be established. In some embodiments, the redistribution structures RS respectively include a conductive line CL and a redistribution pad RP. The conductive line CL extends from one of the conductive pads AP of the top device die 110 to one of the redistribution pads RP. For instance, as shown in FIG. 1A, the conductive line CL extends from a bottom surface of one of the conductive pads AP of the top device die 110, and is in lateral contact with one of the redistribution pads RP. As shown in FIG. 1B, the conductive line CL may be formed as a straight line, or may have at least one turn along its extending direction. On the other hand, the electrical connectors EC connecting the bottom device die 100 to the package substrate 120 extend to the central portion of the bottom device die 100, and are in contact with the conductive pads AP of the bottom device die 100 without a redistribution structure in between. In other words, the conductive pads AP of the bottom device die 100 overlap the electrical connectors EC connected thereto.

Referring to FIG. 1A, FIG. 1B and FIG. 1C, an adhesive material AM1 is disposed between the bottom device die 100 and the package substrate 120, and an adhesive material AM2 is disposed between the top device die 110 and the bottom device die 100. As shown in FIG. 1A and FIG. 1B, the adhesive material AM2 does not cover the entire active side AS1 of the top device die 110. Instead, the adhesive material AM2 covers a portion of the top device die 110 that overlaps the bottom device die 100, but the adhesive material AM2 may not extend to the peripheral portion of the top device die 110 to which some of the electrical connectors EC are connected. As a result, the conductive pads AP within the central portion of the top device die 110 and a portion of each conductive line CL connecting such conductive pads AP to the redistribution pads RP are covered by the adhesive material AM2, while the remaining portion of each conductive line CL and the redistribution pads RP are not covered by the adhesive material AM2. It should be noted that, although the adhesive material AM2 is depicted as having edges aligned with edges of the top device die 110, such edges of the adhesive material AM2 may alternatively laterally protrude or recess from such edges of the top device die 110. On the other hand, as shown in FIG. 1A and FIG. 1C, the adhesive material AM1 covering the active side AS2 of the bottom device die 100 is disposed on opposite sides of the conductive pads AP at the active side AS2 of the bottom device die 100, and does not cover such conductive pads AP. In some embodiments, the adhesive material AM1 has two separate sub-portions, each disposed at one side of the conductive pads AP at the active side AS2 of the bottom device die 100. It should be noted that, although the adhesive material AM1 is depicted as having edges aligned with edges of the bottom device die 100, such edges of the adhesive material AM1 may alternatively laterally protrude or recess from such edges of the bottom device die 100.

Referring to FIG. 1A, the package substrate 120 may be a built-up substrate. In some embodiments, the built-up substrate is a core-less built-up substrate, and includes a stack of built-up dielectric layers 122 as well as layers of conductive patterns 124 respectively formed at a side of one of the built-up dielectric layers 122. The layers of conductive patterns 124 may include at least one layer of ground plane, at least one layer of power plane, and at least one layer of signal plane and routing structures connecting the electrical connectors EC to the ground plane(s), the power plane(s), the signal plane(s) and package I/Os 126 formed at the bottom side of the package substrate 120. The topmost conductive patterns 124 are in contact with the electrical connectors EC, while the bottommost conductive patterns 124 are in contact with the package I/Os 126. In certain embodiments, a signal plane spans between a ground plane and a power plane. The routing structures may include conductive traces and conductive vias. The conductive traces respectively extend on a surface of one of the built-up dielectric layers 122, while the conductive vias respectively penetrate one or more of the built-up dielectric layers 122 and electrically connect the electrical connectors EC to the ground plane(s), the signal plane(s), the power plane(s) or the package I/Os 126. As a result, some of the conductive vias may penetrate through the entire stack of built-up dielectric layers 122, and may be referred as conductive through vias. The ground plane(s) is/are electrically grounded or configured to receive a reference voltage. The power plane(s) is/are configured to receive one or more power supply voltage(s). The signal plane(s) may be configured to transmit input/out signals between the die stack and the package I/Os 126. In some embodiments, the package I/Os 126 may be ball-grid-array (BGA) balls, controlled-collapse-chip-connection (C4) bumps or the like.

Alternatively, the package substrate 120 may include a rigid dielectric core layer. In such alternative embodiments, one of the built-up dielectric layers 122 shown in FIG. 1A may be replaced by the dielectric core layer. For instance, the middle one of the stack of built-up dielectric layers 122 may be replaced by the dielectric core layer. The dielectric core layer may have a thickness significantly greater than a thickness of each built-up dielectric layer 122. As a result of the rigid dielectric layer, a mechanical strength of the package substrate 120 may be improved. On the other hand, the core-less built-up substrate shown in FIG. 1A may have advantages such as light weight and low z-height.

Referring to FIG. 1A, the semiconductor package 10 further includes an encapsulant 130. The encapsulant 130 laterally encapsulates the die stack including the top device die 110 and the bottom device die 100. In addition, the encapsulant 130 fills the space between the top device die 110 and the package substrate 120, and fills the space between the bottom device die 100 and the package substrate 120. As a result, each of the electrical connectors EC is laterally surrounded by the encapsulant 130. In some embodiments, the die stack (including the top device die 110 and the bottom device die 100) are over-molded by the encapsulant 130. In such embodiments, a top surface of the top device die 110 is covered by a top portion of the encapsulant 130. In addition, in some embodiments, a sidewall of the encapsulant 130 is substantially co planar with a sidewall of the package substrate 120. The encapsulant 130 includes a molding compound, such as epoxy resin. In some embodiments, the encapsulant 130 further includes filler particles (not shown) dispersed in the molding compound. The filler particles may typically be made of an inorganic material (e.g., silica), and are configured to modify a material property of the encapsulant 130 (e.g., coefficient of thermal expansion (CTE)).

As described above, the semiconductor package 10 according to some embodiments of the present disclosure is a dual die semiconductor package, and includes the bottom device die 100 and the top device die 110 stacked over the bottom device die 100. The bottom device die 100 and the top device die 110 are bonded to the package substrate 120 through the electrical connectors EC, and the active side AS2 of the bottom device die 100 as well as the active side AS1 of the top device die 110 both face toward the package substrate 120. As compared to a multi-die semiconductor package in which an active side of each device die faces away from a package substrate and is electrically connected to the package substrate through bonding wires, the electrical connectors EC of the present disclosure may have a smaller length. Moreover, the electrical connectors EC may have a thicker diameter as a result of having the conductive pillars CP rather than the bonding wires. Therefore, resistivity of the electrical connectors EC as well as impedance of the electrical connectors EC under high frequency can be lowered, and electrical connection between the die stack (including the bottom device die 100 and the top device die 110) can be improved. In order to realize such electrical connection between the device dies and the package substrate 120, the top device die 110 may be laterally offset from the bottom device die 100, and electrical connectors EC connected to the top device die 110 may have a vertical length greater than a vertical length of the electrical connectors EC connected to the bottom device die 100. In other words, the electrical connectors EC with different vertical lengths are used for connecting the device dies in the die stack to the package substrate 120.

In alternative embodiments, the die stack may include three or more device dies. In other words, additional device die(s) (not shown) may be further stacked on the top device die 110. Such additional device die(s) may be laterally offset from the underlying ones, and are electrically connected to the package substrate 120 through electrical connectors similar to the electrical connectors EC as described above.

Figure 2:
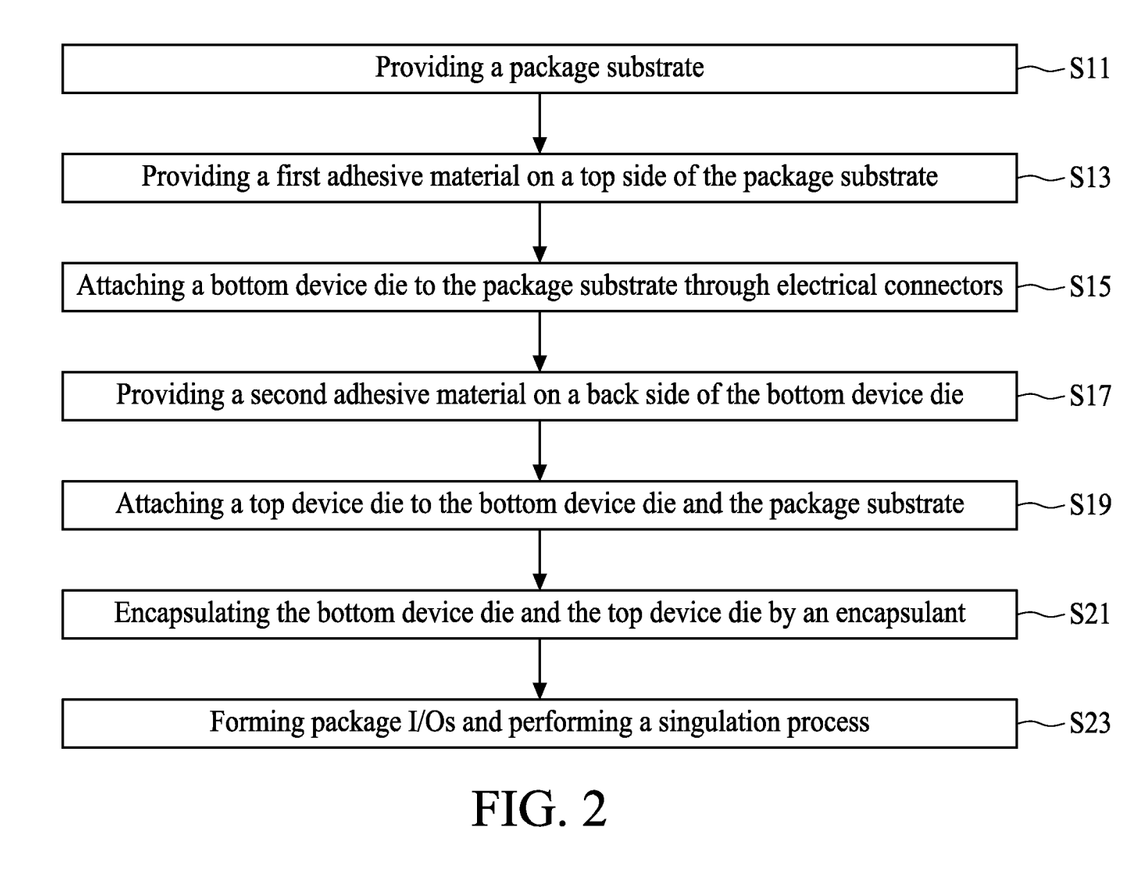
FIG. 2 is a flow diagram of a manufacturing method for forming the semiconductor package shown in FIG. 1A.

FIG. 2 is a flow diagram of a manufacturing method for forming the semiconductor package shown in FIG. 1A. FIG. 3A through FIG. 3F are schematic cross-sectional views illustrating structures at various stages during the manufacturing process of the semiconductor package shown in FIG. 1A.

Figure 3A:
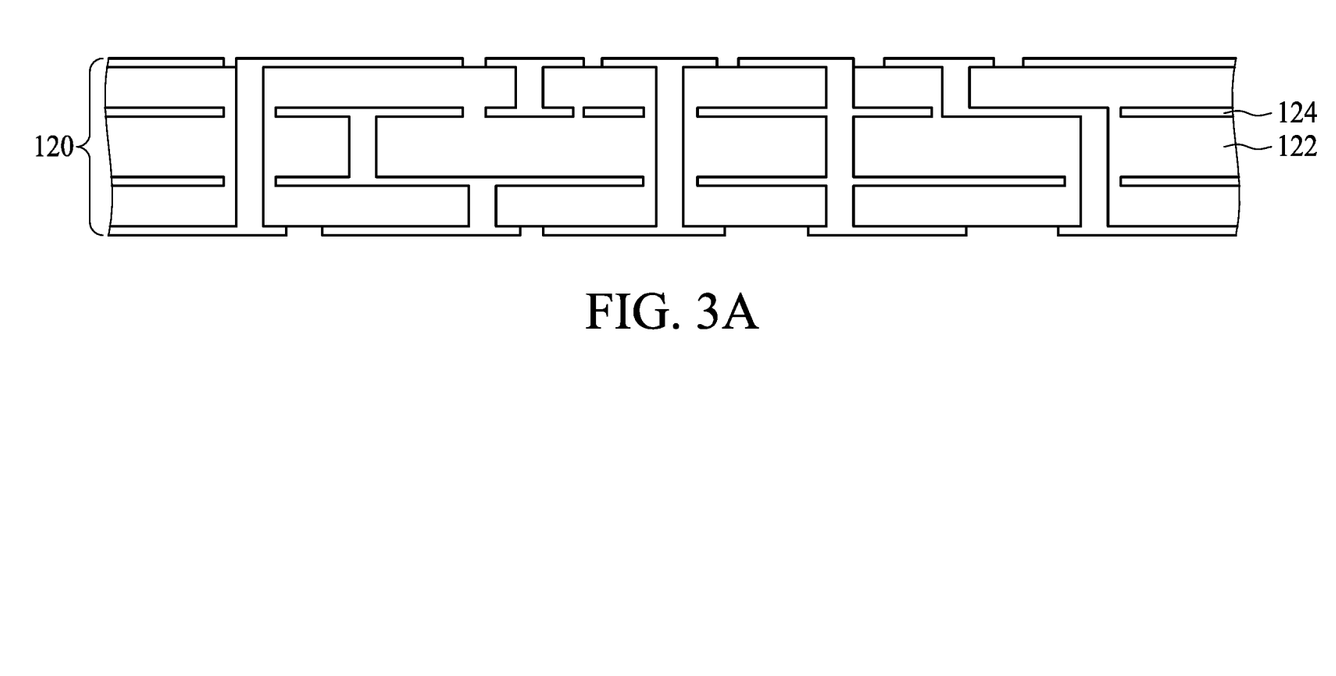
FIG. 3A through FIG. 3F are schematic cross-sectional views illustrating structures at various stages during the manufacturing process of the semiconductor package shown in FIG. 1A.

Referring to FIG. 2 and FIG. 3A, step S11 is performed, and the package substrate 120 is pre pared. In some embodiments, the package substrate 120 is a core-less built-up substrate. In such embodiments, the built-up dielectric layers 122 and layers of the conductive patterns 124 are alternately formed on a carrier (not shown). Formation of each built-up dielectric layer 122 may include a lamination process. In addition, formation of each layer of the conductive patterns 124 may include a lithography process and a plating process, and may further include an etching process for forming conductive via(s) in the underlying built-up dielectric layer 122. Next, the carrier (not shown) may be debonded from the structure formed above, and the remaining structure forms the package substrate 120. In alternative embodiments, the package substrate 120 has a core dielectric layer.

In such embodiments, the built-up dielectric layers 122 and the layers of conductive patterns 124 are formed on a single side or opposite sides of the core dielectric layer, and a conductive through via may be formed in the core dielectric layer by a drilling process (e.g., a laser drilling process).

Figure 3B:
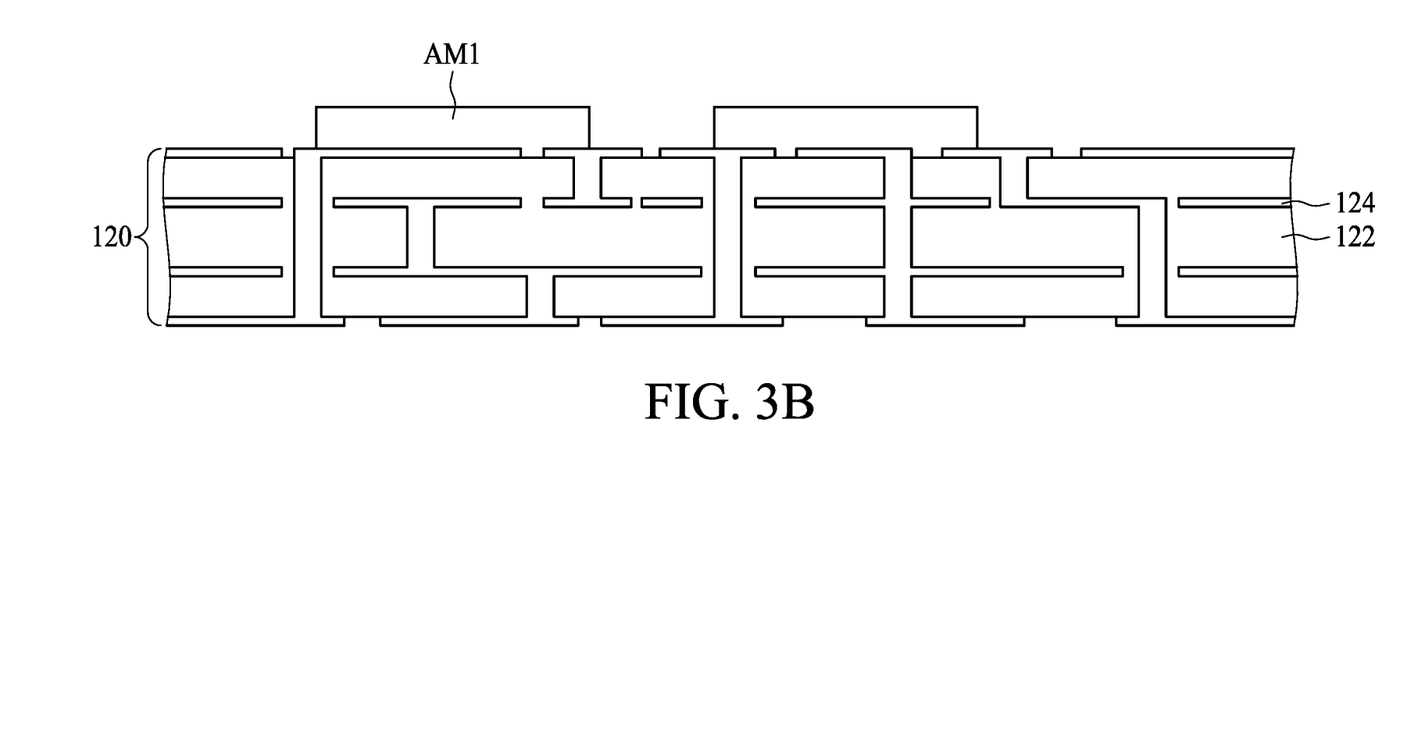

Referring to FIG. 2 and FIG. 3B, step S13 is performed, and the adhesive material AM1 is provided on a top side of the package substrate 120. In some embodiments, the adhesive material AM1 is dispensed on the package substrate 120. As described with reference to FIG. 1A and FIG. 1C, the adhesive material AM1 may be formed as two separate sub-portions. Some of the topmost conductive patterns 124 of the package substrate 120 may be exposed in a space between the sub-portions of the adhesive material AM1, so as to be attached with the electrical connectors EC connected to the bottom device die 100 in the subsequent step (shown in FIG. 3C).

Figure 3C:
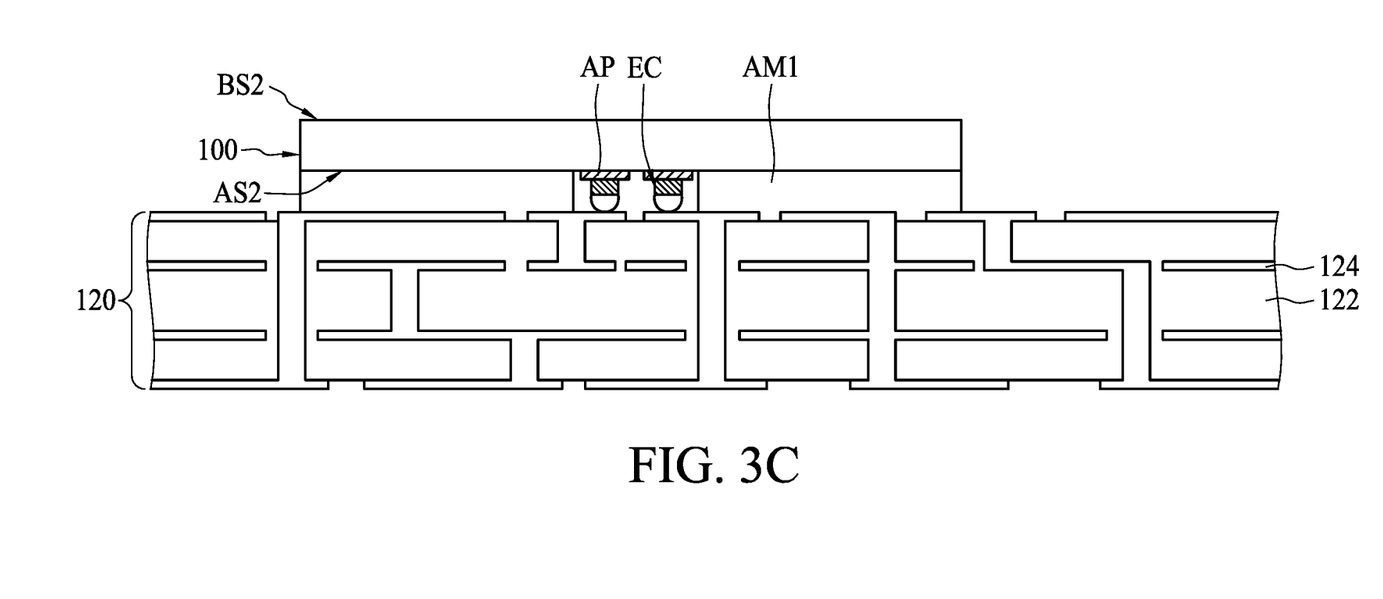

Referring to FIG. 2 and FIG. 3C, step S15 is performed, and the bottom device die 100 is attached to the package substrate 120 through some of the electrical connectors EC. In some embodiments, the electrical connectors EC are pre-formed on the conductive pads AP of the bottom device die 100, and the electrical connectors EC are attached to the portions of the conductive patterns 124 exposed between the sub-portions of the adhesive material AM1. Meanwhile, other portions of the active side AS2 of the bottom device die 100 are in contact with the adhesive material AM1. In some embodiments, a pick and place process is used for attaching the bottom device die 100 to the package substrate 120. In addition, a thermal treatment may be subsequently performed for bonding the bottom device die 100 to the package substrate 120.

In alternative embodiments, the adhesive material AM1 may be provided on the active side AS2 of the bottom device die 100 before the bonding of the bottom device die 100 to the package substrate 120.

Figure 3D:
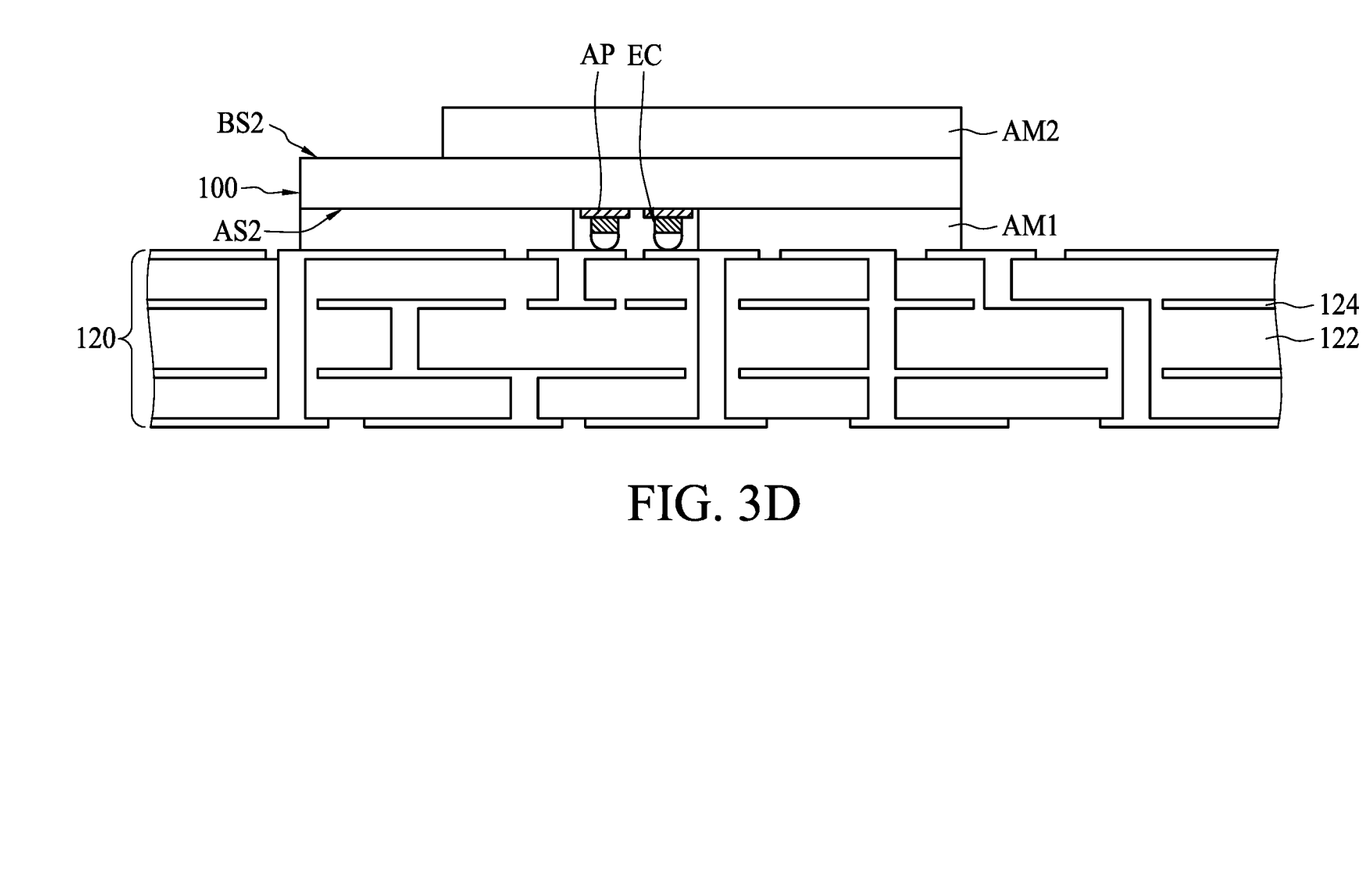

Referring to FIG. 2 and FIG. 3D, step S17 is performed, and the adhesive material AM2 is provided on the back side BS2 of the bottom device die 100. As described with reference to FIG. 1A and FIG. 1B, in some embodiments, the adhesive material AM2 does not have to cover the entire back side BS2 of the bottom device die 100 because the subsequently-attached top device die 110 is laterally offset from the bottom device die 100. For instance, as shown in FIG. 3D, a left peripheral region of the back side BS2 of the bottom device die 100 is not covered by the adhesive material AM2. In some embodiments, a method for providing the adhesive material AM2 includes a dispensing process.

Figure 3E:
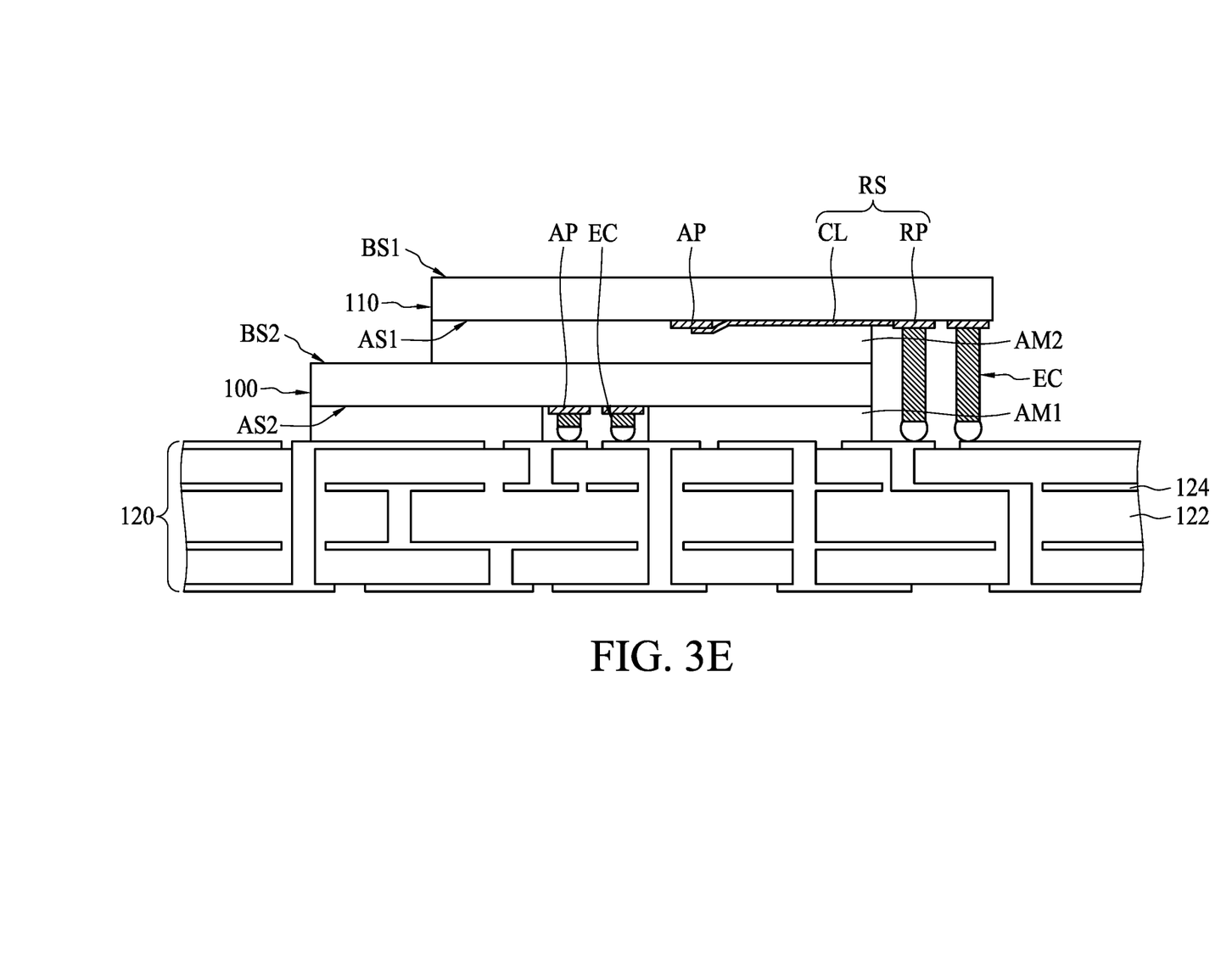

Referring to FIG. 2 and FIG. 3E, step S19 is performed, and the top device die 110 is attached to bottom device die 100 and the package substrate 120. The active side AS1 of the top device die 110 faces toward the bottom device die 100 and the package substrate 120. A portion of the top device die 110 is attached to the bottom device die 100 via the adhesive material AM2, while another portion of the top device die 110 is in contact with the package substrate 120 through some of the electrical connectors EC. In some embodiments, such electrical connectors EC are pre-formed on the redistribution pads RP of the redistribution structures RS configured for routing the conductive pads AP within a central region of the top device die 110 to a peripheral region of the top device die 110, and the electrical connectors EC are attached to topmost portions of the conductive patterns 124 of the package substrate 120. In such embodiments, the conductive pads AP and some portions of the redistribution structures RS (e.g., some portions of the conductive lines CL) may be embedded in the adhesive material AM2. In some embodiments, a pick and place process is used for attaching the top device die 110 to the bottom device die 100 and the package substrate 120. In addition, a thermal treatment may be subsequently performed for bonding the top device die 110 to the package substrate 120.

In alternative embodiments, the adhesive material AM2 may be provided on the active side AS1 of the top device die 110 before the top device die 110 is bonded to the bottom device die 100 and the package substrate 120.

Figure 3F:
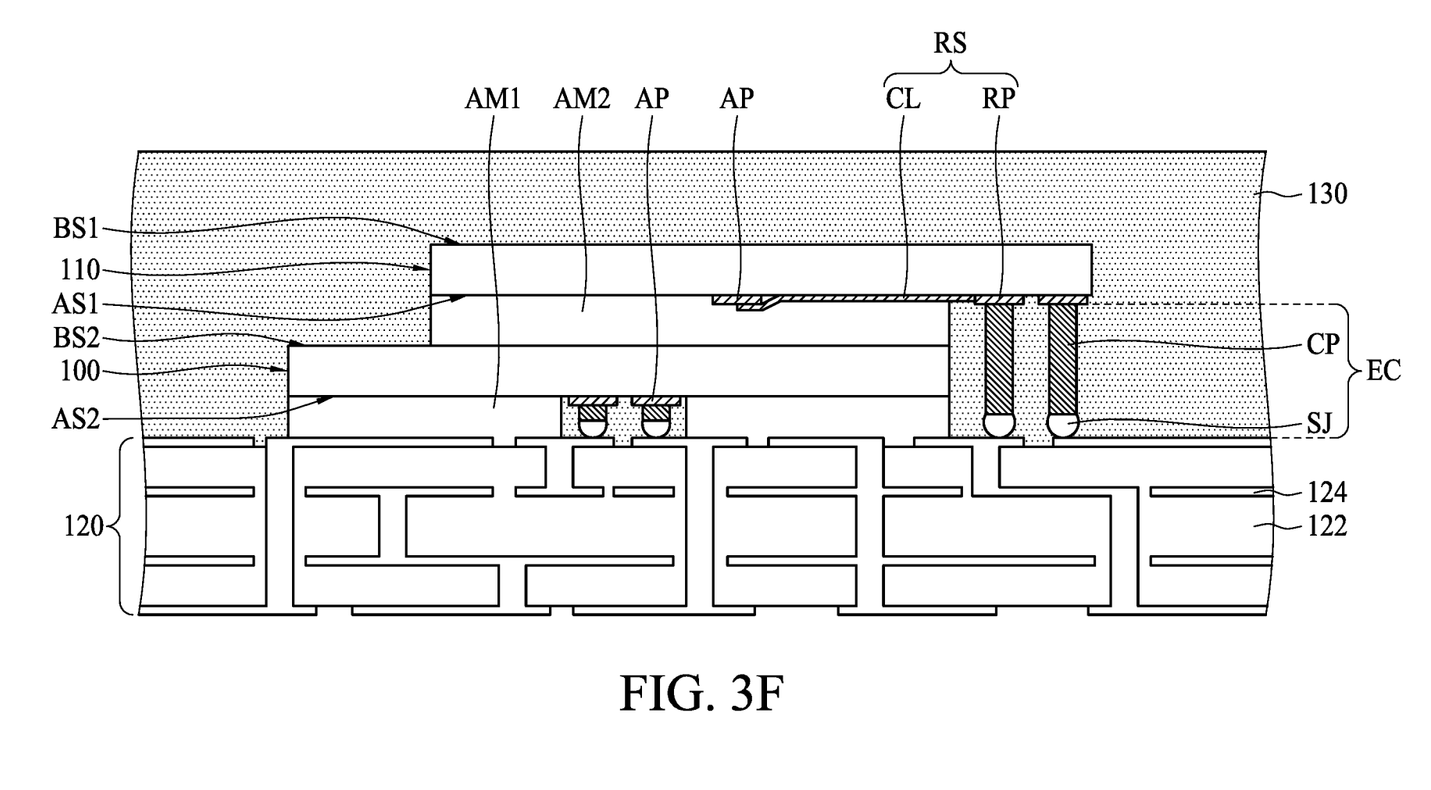

Referring to FIG. 2 and FIG. 3F, step S21 is performed, and the bottom device die 100 and the top device die 110 are encapsulated by the encapsulant 130. In some embodiments, a transfer-molding process, a compression-molding process or other viable molding process can be used for forming the encapsulant 130.

Referring to FIG. 2 and FIG. 1A, step S23 is performed, such that the package I/Os 126 are formed, and a singulation process is performed. The package I/Os 126 are formed at the bottom surface of the package substrate 120, and are in electrical contact with bottom portions of the conductive patterns 124. In some embodiments, a method for forming the package I/Os 126 includes a ball placement process or other viable process. The singulation process, such as a blade sawing process, a plasma-dicing process, or the like, is performed, forming the semiconductor device 10 as one of the singulated structures. In some embodiments, the formation of the package I/Os 126 precedes the singulation process. However, in alternative embodiments, the singulation process is followed by the formation of the package I/Os 126.

Thus, the semiconductor package 10 according to some embodiments is complete.

Figure 4:
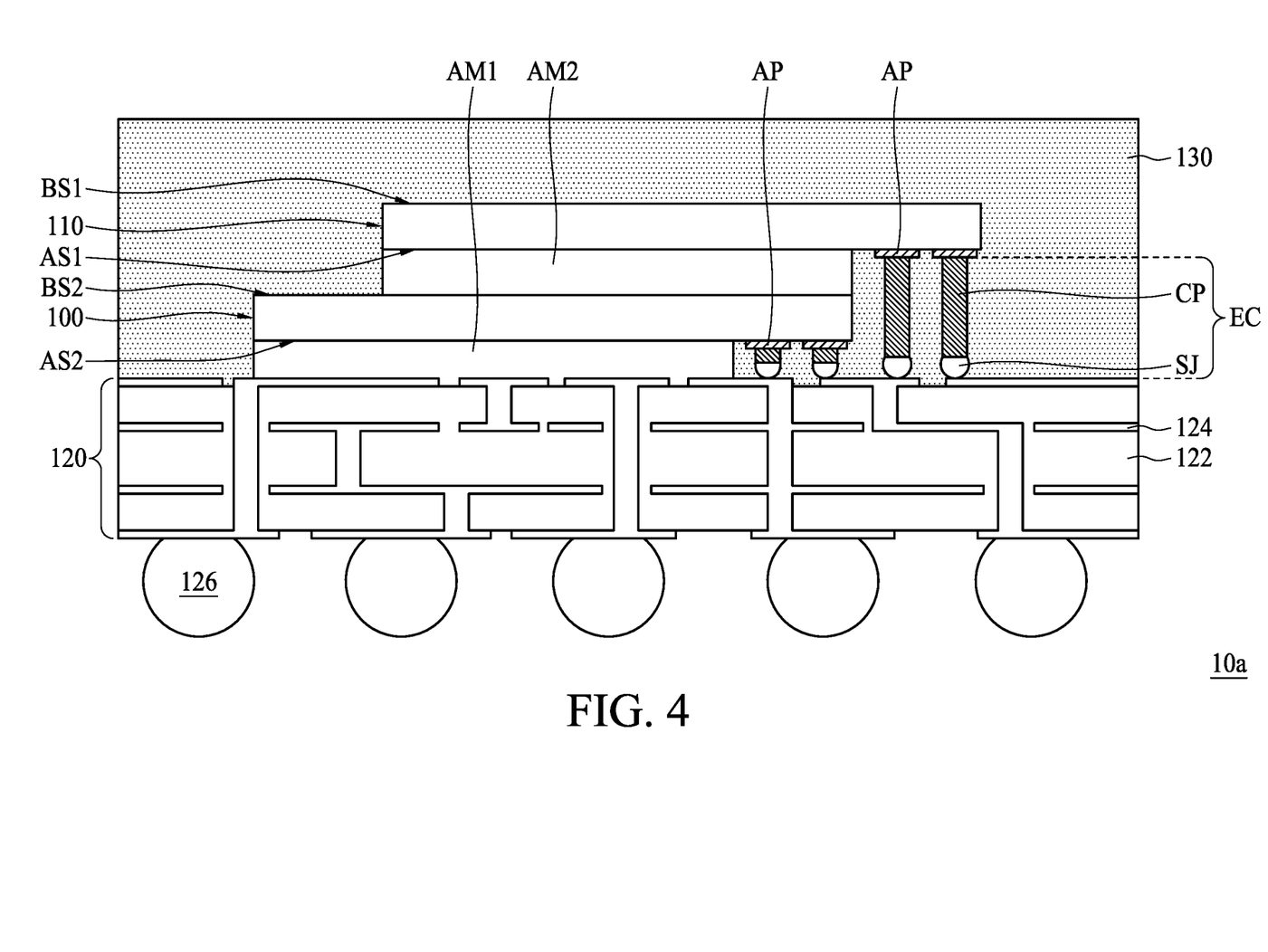
FIG. 4 is a schematic cross-sectional view illustrating a semiconductor package according to some embodiments of the present disclosure.

FIG. 4 is a schematic cross-sectional view illustrating a semiconductor package 10a according to other embodiments of the present disclosure. The semiconductor package 10a is similar to the semiconductor package 10 shown in FIG. 1A; only the differences therebetween will be described, and descriptions of similar or same portions are not repeated herein.

Referring to FIG. 4, in some embodiments, the conductive pads AP of the bottom device die 100 are formed within a peripheral region of the active side AS2 of the bottom device die 100. In such embodiments, the adhesive material AM1 covers the remaining portion of the active side AS2 of the bottom device die 100, and may be formed as a continuous pattern, rather than as separate sub-patterns. Similarly, the conductive pads AP of the top device die 110 are formed within a peripheral region of the active side AS1 of the top device die 110. As a result, the redistribution structures RS as described with reference to FIG. 1A and FIG. 1B may be omitted, and the electrical connectors EC connecting the top device die 110 to the package substrate 120 are in contact with the conductive pads AP instead of the redistribution pads RP (as shown in FIG. 1A and FIG. 1B). In some embodiments, as shown in FIG. 4, the electrical connectors EC connected to the top device die 110 and the electrical connectors EC connected to the bottom device die 100 are located at the same side of the die stack. However, in alternative embodiments, the electrical connectors EC connected to the top device die 110 and the electrical connectors EC connected to the bottom device die 100 are located at different sides of the die stack. In some other embodiments, the conductive pads AP of the top device die 110 are located within a central portion of the top device die as shown in FIG. 1A and FIG. 1B, while the conductive pads AP of the bottom device die 100 are located within the peripheral region of the bottom device die 100 as described with reference to FIG. 4.

As described above, the semiconductor package according to embodiments of the present disclosure includes a bottom device die and a top device die stacked over the bottom device die. The bottom device die and the top device die are bonded to a package substrate through electrical connectors, and active sides of the bottom device die and the top device die both face toward the package substrate. As compared to a multi-die semiconductor package in which an active side of each device die faces away from a package substrate and is electrically connected to the package substrate through bonding wires, the electrical connectors of the present disclosure may have a smaller length. Moreover, the electrical connectors of the present disclosure may have a thicker diameter due to having conductive pillars, rather than bonding wires. Therefore, resistivity of the electrical connectors as well as impedance of the electrical connectors under high frequency can be reduced, and electrical connection between the die stack (including the bottom device die and the top device die) can be improved.

In an aspect of the present disclosure, a semiconductor package is provided. The semiconductor package comprises a first device die, attached to a package substrate, wherein an active side of the first device die faces toward the package substrate; first electrical connectors, connecting the active side of the first device die to the package substrate; a second device die, stacked over the first device die, wherein an active side of the second device die faces toward the package substrate, and a portion of the active side of the second device die is outside an area that overlaps the first device die; and second electrical connectors, connecting the portion of the active side of the second device die to the package substrate.

In another aspect of the present disclosure, a semiconductor package is provided. The semiconductor package comprises a first device die, attached to a package substrate, wherein an active side of the first device die faces toward the package substrate; first electrical connectors, connecting the active side of the first device die to the package substrate; a second device die, stacked over the first device die and having conductive pads and redistribution structures at an active side of the second device die, wherein the active side of the second device die faces toward the package substrate, the conductive pads are located within a central region of the active side of the second device die overlapping the first device die, and the redistribution structures connect the conductive pads to a peripheral region of the active side of the second device die not overlapping the first device die; and second electrical connectors, connecting the package substrate to portions of the redistribution structures within the peripheral region of the active side of the second device die.

In yet another aspect of the present disclosure, a manufacturing method of a semiconductor package is provided. The method comprises attaching a first device die to a package substrate, wherein an active side of the attached first device die faces toward the package substrate, first electrical connectors are pre-formed on the active side of the first device die before attachment of the first device die, and the electrical connectors connect the active side of the first device die to the package substrate after the attachment of the first device die; and attaching a second device die to the first device die and the package substrate, wherein an active side of the attached second device die faces toward the first device die and the package substrate, a portion of the active side of the attached second device die is outside an area that overlaps the attached first device die, second electrical connectors are pre-formed on the portion of the active side of the second device die before attachment of the second device die, and the second electrical connectors connect the portion of the active side of the second device die to the package substrate after the attachment of the second device die.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor package, comprising:
   a first device die, attached to a package substrate, wherein an active side of the first device die faces toward the package substrate;
   first electrical connectors, connecting the active side of the first device die to the package substrate;
   a second device die, stacked over the first device die and having conductive pads and redistribution structures at an active side of the second device die, wherein the active side of the second device die faces toward the package substrate, the conductive pads are located within a central region of the active side of the second device die overlapping the first device die, and the redistribution structures connect the conductive pads to a peripheral region of the active side of the second device die not overlapping the first device die; and
   second electrical connectors, connecting the package substrate to portions of the redistribution structures within the peripheral region of the active side of the second device die.

2. The semiconductor package according to claim 1, wherein the redistribution structures respectively comprise:
   a redistribution pad located within the peripheral region of the active side of the second device die; and
   a conductive line, connecting the redistribution pad to one of the conductive pads.

3. The semiconductor package according to claim 2, wherein the second electrical connectors connect the redistribution pads to the package substrate.

4. The semiconductor package according to claim 1, wherein the first device die has conductive pads formed at the active side of the first device die, and the first electrical connectors connect the conductive pads of the first device die to the package substrate.

5. A manufacturing method of a semiconductor package, comprising:

attaching a first device die to a package substrate, wherein an active side of the attached first device die faces toward the package substrate, first electrical connectors are pre-formed on the active side of the first device die before attachment of the first device die, and the electrical connectors connect the active side of the first device die to the package substrate after the attachment of the first device die;

attaching a second device die to the first device die and the package substrate, wherein an active side of the attached second device die faces toward the first device die and the package substrate, a portion of the active side of the attached second device die is outside an area that overlaps the attached first device die, second electrical connectors are pre-formed on the portion of the active side of the second device die before attachment of the second device die, and the second electrical connectors connect the portion of the active side of the second device die to the package substrate after the attachment of the second device die; and forming a first adhesive material on the package substrate before the attachment of the first device die, wherein the first adhesive material is disposed between the package substrate and the active side of the first device die after the attachment of the first device die.

6. The manufacturing method of the semiconductor package according to claim 5, further comprising:

forming a second adhesive material on the first device die before the attachment of the second device die, wherein the second adhesive material is disposed between the first device die and the active side of the second device die after the attachment of the second device die.

7. The manufacturing method of the semiconductor package according to claim 5, wherein the second device die is pre-formed with conductive pads and redistribution structures at the active side of the second device die, the conductive pads are located within a central region of the active side of the second device die overlapping the first device die, the redistribution structures connect the conductive pads to a peripheral region of the active side of the second device die outside of an area overlapping the first device die, and the second electrical connectors connect the redistribution structures to the package substrate after the attachment of the second device die.

8. The manufacturing method of the semiconductor package according to claim 5, further comprising:

laterally encapsulating the first and second device dies by an encapsulant after the attachment of the second device die.

9. The manufacturing method of the semiconductor package according to claim 5, further comprising:

forming package inputs/outputs (I/Os) at a side of the package substrate facing away from the attached first and second device dies.

* * * * *